(12) United States Patent
Kadota (10) Patent No.: US 7,863,801 B2
(45) Date of Patent: Jan. 4, 2011

(54) ACOUSTIC WAVE DEVICE

(75) Inventor: Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 91 days.

(21) Appl. No.: 12/272,841

(22) Filed: Nov. 18, 2008

(65) Prior Publication Data

US 2009/0058225 A1 Mar. 5, 2009

Related U.S. Application Data

(63) Continuation of application No. PCT/JP2007/059835, filed on May 14, 2007.

(30) Foreign Application Priority Data

May 30, 2006 (JP) .............................. 2006-149853

(51) Int. Cl.
*H01L 41/08* (2006.01)
(52) U.S. Cl. .................. 310/313 A; 310/313 R
(58) Field of Classification Search ............ 310/313 R, 310/313 A, 313 B, 346
See application file for complete search history.

(56) References Cited

U.S. PATENT DOCUMENTS

| | | | | |
|---|---|---|---|---|
| 3,965,444 A | * | 6/1976 | Willingham et al. ........ 333/155 |
| 4,037,176 A | * | 7/1977 | Ono et al. .................... 333/155 |
| 7,135,805 B2 | | 11/2006 | Yamanouchi | |
| 7,322,093 B2 | * | 1/2008 | Kadota et al. ................. 29/594 |
| 7,327,205 B2 | * | 2/2008 | Taniguchi .................... 333/133 |
| 7,581,306 B2 | * | 9/2009 | Kadota et al. ................. 29/594 |
| 2005/0057323 A1 | | 3/2005 | Kando | |
| 2006/0138902 A1 | | 6/2006 | Kando | |
| 2007/0018536 A1 | | 1/2007 | Kadota et al. | |

FOREIGN PATENT DOCUMENTS

| | | |
|---|---|---|
| EP | 1 635 459 A1 | 3/2006 |
| JP | 07-226642 A | 8/1995 |
| JP | 2001-044787 A | 2/2001 |
| JP | 2005-142629 A | 6/2005 |
| JP | 2005-260296 A | 9/2005 |

OTHER PUBLICATIONS

Official Communication issued in corresponding German Patent Application No. 11 2007 001 259, mailed on Feb. 2, 2010.
Official Communication issued in International Patent Application No. PCT/JP2007/059835, mailed on Jul. 31, 2007.

* cited by examiner

*Primary Examiner*—Mark Budd
(74) *Attorney, Agent, or Firm*—Keating & Bennett, LLP

(57) ABSTRACT

An acoustic wave device includes a piezoelectric substrate, IDT electrodes, temperature characteristic-improving layer, and frequency-adjusting layer arranged on the piezoelectric substrate in that order. The piezoelectric substrate has a negative temperature coefficient of frequency TCF. The temperature characteristic-improving layer is made of a material having a positive temperature coefficient of frequency TCF. The frequency-adjusting layer includes a glass thin-film having a velocity of transverse wave less than a velocity of transverse wave of the temperature characteristic-improving layer.

7 Claims, 5 Drawing Sheets

ACOUSTIC WAVE DEVICE

BACKGROUND OF THE INVENTION

1. Field of the Invention

The present invention relates to acoustic wave devices using acoustic waves, such as surface acoustic waves or boundary acoustic waves. More particularly, the present invention relates to an acoustic wave device including a temperature characteristic-improving layer arranged to adjust the temperature coefficient of frequency of the device that is disposed on a piezoelectric substrate.

2. Description of the Related Art

Surface acoustic wave devices are widely used as band filters for mobile phones. Japanese Unexamined Patent Application Publication No. 2001-44787 discloses an example of such a surface acoustic wave device.

Figure 8:
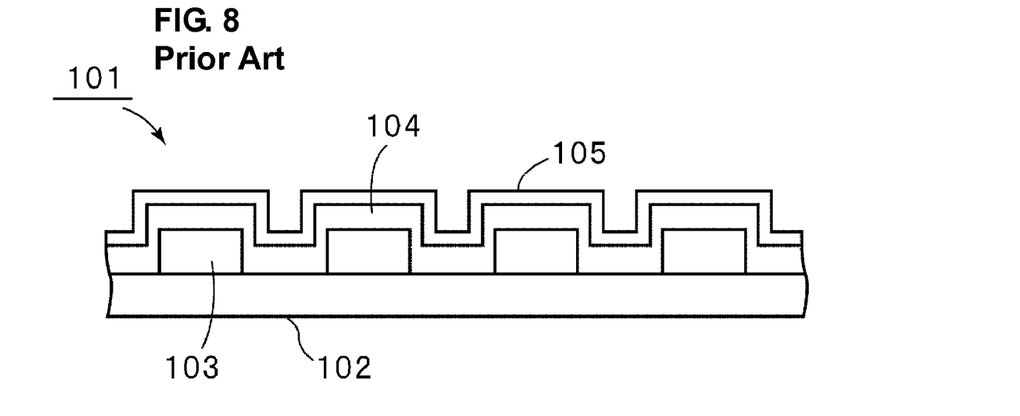
FIG. 8 is a schematic front sectional view of an example of a conventional surface acoustic wave device.

FIG. 8 is a schematic front sectional view of the surface acoustic wave device disclosed in Japanese Unexamined Patent Application Publication No. 2001-44787. The surface acoustic wave device 101 includes a piezoelectric substrate 102 and interdigital electrodes (IDT electrodes) 103 disposed thereon. An insulating protective layer 104 having a coefficient of linear expansion that is less than that of the piezoelectric substrate 102 extends over the interdigital electrodes 103. The insulating protective layer 104 is covered with a frequency-adjusting layer 105.

The insulating protective layer 104 reduces variations in frequency characteristics due to temperatures, that is, the insulating protective layer 104 is used as a temperature characteristic-improving layer. The insulating protective layer 104 is made of $SiO_2$.

The frequency-adjusting layer 105 is made of $Si_xN_y$ having a wave velocity (a velocity of transverse wave of about 6000 m/s) greater than that of $SiO_2$, wherein x and y depend on the composition thereof. Frequencies such as the center frequency and resonant frequency of the device are controlled by adjusting the thickness of the frequency-adjusting layer 105.

Figure 9:
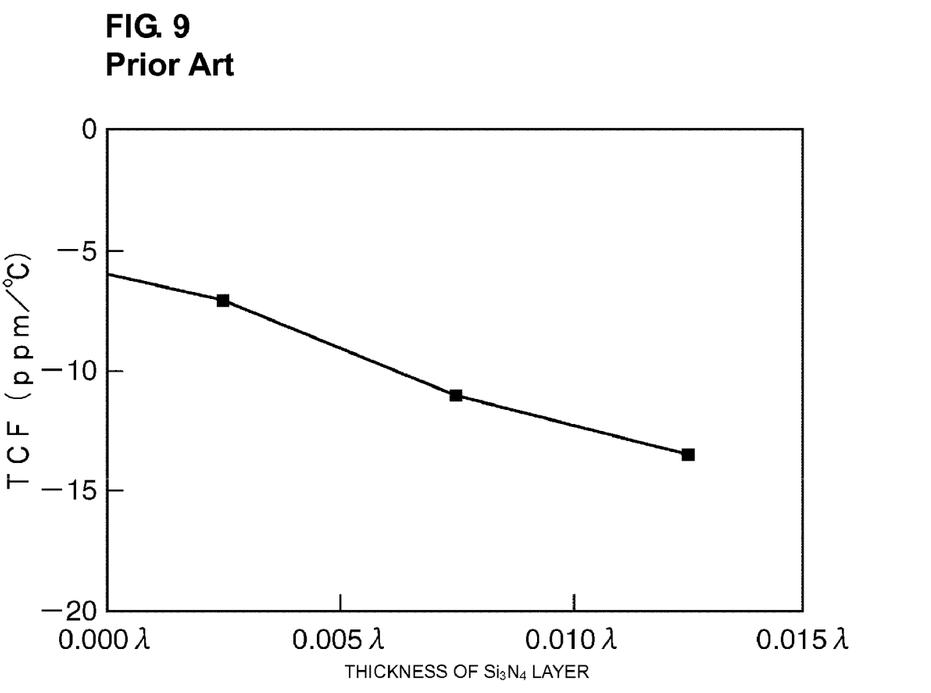
FIG. 9 is a graph showing the relationship between the thickness of a $Si_3N_4$ layer which is included in the conventional acoustic wave device and which is used as a frequency-adjusting layer and the temperature coefficient of frequency TCF.

In the surface acoustic wave device 101 disclosed in Japanese Unexamined Patent Application Publication No. 2001-44787, the insulating protective layer 104 is used to improve the frequency-temperature characteristic and the frequency-adjusting layer 105 is used to control the frequencies as described above. With $Si_3N_4$ layers, each functioning as the frequency-adjusting layer 105, having a wave velocity (about 5850 to about 6010 m/s) and a thermal expansion coefficient (about $3.4 \times 10^{-6}/°C$.) that are greater than those of $SiO_2$ (a thermal expansion coefficient of about $0.55 \times 10^{-6}/°C$.) are formed, there is a problem in that advantages due to the presence of $SiO_2$ layers are deteriorated because the absolute value of each temperature coefficient of frequency (TCF), which indicates the frequency-temperature characteristic, particularly a variation in frequency due to temperature, is increased as shown in FIG. 9. With reference to FIG. 9, $\lambda$ along the horizontal axis represents the wavelength of an acoustic wave, such as a surface acoustic wave or a boundary acoustic wave.

SUMMARY OF THE INVENTION

To overcome the problems described above, preferred embodiments of the present invention provide an acoustic wave device that includes a temperature characteristic-improving layer arranged to improve temperature characteristics and a frequency-adjusting layer disposed thereon. The frequency-adjusting layer is provided to adjust a frequency. Temperature characteristics of the acoustic wave device are not significantly deteriorated by the presence of the frequency-adjusting layer.

A preferred embodiment of the present invention provides an acoustic wave device that includes a piezoelectric substrate, IDT electrodes disposed on the piezoelectric substrate, a temperature characteristic-improving layer extending over the piezoelectric substrate and the IDT electrodes, and a frequency-adjusting layer disposed on the temperature characteristic-improving layer. The piezoelectric substrate is made of a piezoelectric material having a negative temperature coefficient of frequency TCF. The temperature characteristic-improving layer is made of a material having a positive temperature coefficient of frequency TCF. The frequency-adjusting layer includes a glass thin-film that has a velocity of transverse wave less than the velocity of transverse wave of the temperature characteristic-improving layer and also has a coefficient of linear expansion less than the coefficient of linear expansion of the piezoelectric substrate.

Another preferred embodiment of the present invention provides an acoustic wave device that includes a piezoelectric substrate, IDT electrodes disposed on the piezoelectric substrate, a first temperature characteristic-improving layer extending over the piezoelectric substrate and the IDT electrodes, a frequency-adjusting layer disposed on the first temperature characteristic-improving layer, and a second temperature characteristic-improving layer disposed on the frequency-adjusting layer. The piezoelectric substrate is made of a piezoelectric material having a negative temperature coefficient of frequency TCF. The first and second temperature characteristic-improving layers are made of a material having a positive temperature coefficient of frequency TCF. The frequency-adjusting layer includes a glass thin-film that has a velocity of transverse wave less than the velocity of transverse wave of the first and second temperature characteristic-improving layers and also has a coefficient of linear expansion less than the coefficient of linear expansion of the piezoelectric substrate.

In each of the preferred embodiments described above, the temperature characteristic-improving layer is made of the material having a positive temperature coefficient of frequency TCF and the piezoelectric substrate is made of the piezoelectric material having a negative temperature coefficient of frequency TCF. Thus, the presence of the temperature characteristic-improving layer allows the absolute values of the temperature coefficient of frequency TCF of the device to be relatively small. Since the frequency-adjusting layer is used to adjust the frequency and the velocity of transverse wave of the frequency-adjusting layer is less than the temperature characteristic-improving layer, the presence of the frequency-adjusting layer prevents the temperature coefficient of frequency TCF of the device from varying.

The glass thin-film is preferably made of an inorganic material prepared by mixing at least two inorganic oxides and one of the at least two inorganic oxides is a silicon oxide, for example. This is effective to adjust the wave velocity to a lower velocity and is effective to adjust the coefficient of linear expansion.

The glass thin-film is preferably made of an inorganic material having a coefficient of linear expansion less than the coefficient of linear expansion of the acoustic wave device. This is effective in securely preventing characteristics of the device from varying due to temperature changes.

The acoustic wave devices may preferably be a boundary acoustic wave device using a boundary acoustic wave propagating along the interface between the piezoelectric substrate and the temperature characteristic-improving layer or may preferably be a surface acoustic wave device using a surface acoustic wave propagating on the piezoelectric substrate.

Each of the temperature characteristic-improving layers is preferably made of at least one selected from the group consisting of silicon oxides, titanium oxides, and aluminum oxides, for example.

In the acoustic wave device according to the preferred embodiment described above, the temperature characteristic-improving layer, which is made of the material having a positive temperature coefficient of frequency TCF, is disposed on the piezoelectric substrate, which is made of the piezoelectric material having a negative temperature coefficient of frequency TCF. Thus, the absolute value of the temperature coefficient of frequency TCF of the device is relatively small. The frequency-adjusting layer includes the glass thin-film, which has a velocity of transverse wave that is less than the velocity of transverse wave of the temperature characteristic-improving layer and that has a relatively small thermal expansion coefficient. Thus, the presence of the frequency-adjusting layer enables the device to have a reduced frequency and a positively shifted temperature coefficient of frequency TCF. Therefore, even if the temperature characteristic-improving layer has a relatively small thickness and therefore it is difficult to adjust the absolute value of the temperature coefficient of frequency TCF of the device to be close to zero, the presence of the frequency-adjusting layer enables the device to have a temperature coefficient of frequency TCF with an absolute value close to zero. Therefore, the following device can be obtained: an acoustic wave device that is slim, in which the temperature coefficient of frequency TCF does not substantially change, and that is capable of adjusting a frequency to a desired frequency.

According to another preferred embodiment of the present invention, the first and second temperature characteristic-improving layers are preferably made of the material having a positive temperature coefficient of frequency TCF and the piezoelectric substrate is preferably made of the piezoelectric material having a negative temperature coefficient of frequency TCF. Thus, the absolute value of the temperature coefficient of frequency TCF of the device can be reduced. Furthermore, the frequency-adjusting layer preferably includes the glass thin-film having a velocity of transverse wave that is less than the velocity of transverse wave of the first and second temperature characteristic-improving layers and also has a relatively small thermal expansion coefficient. Therefore, the frequency-adjusting layer enables the device to have a reduced frequency and a positive shift of the temperature coefficient of frequency TCF. Therefore, even if the thickness of the first and second temperature characteristic-improving layers are reduced to enable size reduction, and therefore, the absolute value of the temperature coefficient of frequency TCF of the device is relatively large, the presence of the frequency-adjusting layer enables the device to have a temperature coefficient of frequency TCF with an absolute value close to zero. Therefore, the following device can be obtained: an acoustic wave device which is capable of adjusting a frequency to a desired frequency, which is slim, and which has outstanding temperature characteristics. According to this preferred embodiment, the first and second temperature characteristic-improving layers sandwich the frequency-adjusting layer, and therefore, temperature characteristics of the device can be efficiently improved.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will now be described with reference to the accompanying drawings.

Figure 1:
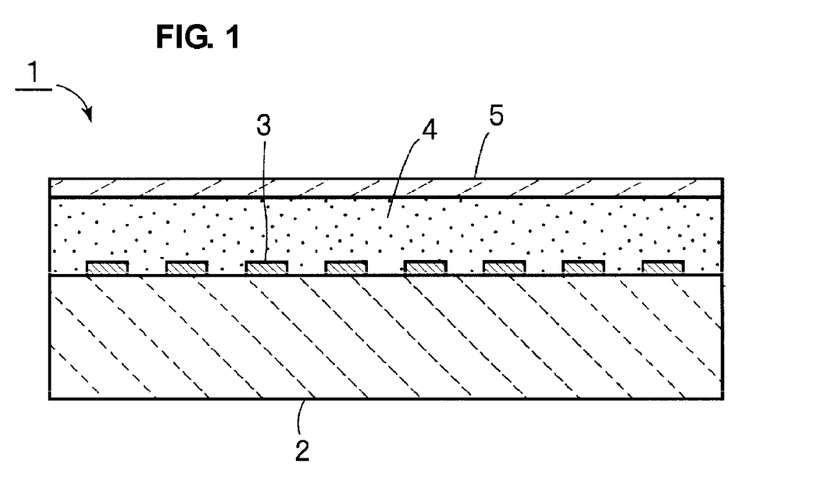
FIG. 1 is a schematic front sectional view of an acoustic wave device according to a first preferred embodiment of the present invention.

FIG. 1 is a front sectional view of an acoustic wave device according to a first preferred embodiment of the present invention. The acoustic wave device 1 utilizes a Love wave derived from a leaky surface acoustic wave.

The acoustic wave device 1 includes a piezoelectric substrate 2. The piezoelectric substrate 2 is preferably made of 38° rotated Y-cut X-propagation $LiTaO_3$, which has a temperature coefficient of frequency TCF of about −42 ppm/° C. and a coefficient of linear expansion ρ of about $16.1 \times 10^{-6}$/° C., for example IDT electrodes 3 are disposed on the piezoelectric substrate 2. The IDT electrodes 3 are preferably made of Cu, for example. The thickness thereof is preferably, but is not limited to, about 0.05λ.

The IDT electrodes 3 may be made of an alloy or a suitable metal other than Cu or may each include a multilayer metal film including a plurality of deposited metal layers, for example. A temperature characteristic-improving layer 4 extends over the IDT electrodes 3. In this preferred embodiment, the temperature characteristic-improving layer 4 preferably includes a SiO$_2$ film with a thickness of about 0.25λ, for example, wherein λ represents the wavelength of a surface acoustic wave.

The SiO$_2$ film has a positive temperature coefficient of frequency, that is, a temperature coefficient of frequency of about 84.2 ppm/° C. The SiO$_2$ film has a velocity of transverse wave of about 3757 m/s and a coefficient of linear expansion of about 0.55×10$^{-6}$/° C.

A frequency-adjusting layer 5 is disposed on the temperature characteristic-improving layer 4. In this preferred embodiment, the frequency-adjusting layer 5 includes a glass thin-film having a velocity of transverse wave that is less than that of the temperature characteristic-improving layer 4. The frequency-adjusting layer 5 has a coefficient of linear expansion that is less than that of the piezoelectric substrate 2.

In the acoustic wave device 1 of this preferred embodiment, the temperature characteristic-improving layer 4 is preferably made of SiO$_2$ and has a positive temperature coefficient of frequency TCF and the piezoelectric substrate 2 is preferably made of LiTaO$_3$ and has a negative temperature coefficient of frequency TCF. Therefore, the presence of the temperature characteristic-improving layer 4 enables the absolute value of the temperature coefficient of frequency TCF of the device to be relatively small, thereby preventing frequency characteristics of the device from being varied due to changes in temperature.

The resonant frequency and/or the center frequency of the device can be adjusted to a desired frequency by adjusting the thickness of the frequency-adjusting layer 5. Since the frequency-adjusting layer 5 has a velocity of transverse wave that is less than that of the temperature characteristic-improving layer 4 and a relatively small thermal expansion coefficient, the presence of the frequency-adjusting layer 5 enables the temperature coefficient of frequency TCF of the device to be positively shifted. Therefore, the frequency-adjusting layer is effective to adjust the resonant frequency and/or the center frequency of the device to a desired frequency, and also is effective to positively shift the temperature coefficient of frequency TCF of the device such that the absolute value of the temperature coefficient of frequency TCF of the device is close to zero.

When the thickness of the temperature characteristic-improving layer 4, which is made of SiO$_2$, is reduced, the overall device has a reduced thickness. In this case, the temperature characteristic-improving layer 4 is insufficient to improve temperature characteristics of the device. However, the presence of the frequency-adjusting layer 5 enables the temperature coefficient of frequency TCF of the device to be close to zero.

Therefore, the acoustic wave device 1 can be easily manufactured so as to have outstanding temperature characteristics and desired frequency characteristics. This will be described in detail below with reference to experiments.

IDT electrodes 3 made of Cu were formed on each piezoelectric substrate 2 made of 38° rotated Y-cut X-propagation LiTaO$_3$ so as to have a thickness of about 0.05λ. A temperature characteristic-improving layer 4 made of SiO$_2$ was formed over the piezoelectric substrate 2 and the IDT electrodes so as to have a thickness of about 0.25λ. A frequency-adjusting layer was formed on the temperature characteristic-improving layer 4 using one of Glasses A to E and X shown in Tables 1 and 2. Different types of acoustic wave devices 1 were prepared using the method described above. The frequency-adjusting layers had different thicknesses. Table 2 shows the velocity of transverse wave and coefficient of linear expansion ρ of each glass and those of SiO$_2$, Si$_3$N$_4$, LiTaO$_3$, and LiNbO$_3$.

TABLE 1

| Compositions of glasses (in weight percent) | | | | | | | | | |
|---|---|---|---|---|---|---|---|---|---|
| Types of Glasses | SiO$_2$ | Ba$_2$O$_3$ | Bi$_2$O$_3$ | ZnO | PbO | Al$_2$O$_3$ | K$_2$O | Na$_2$O | BaO | Others |
| A | 5 | 9 | 76 | 8 | | | | | | 2 |
| B | 55 | | | | 30 | 2 | 7 | 4 | | 2 |
| C | 73 | | | | | 2 | 2 | | 20 | 3 |
| D | 55 | 22 | | 15 | | 5 | | | | 3 |
| E | 68 | 13 | | | | 5 | | 6 | 6 | 2 |
| X | 81 | 13 | | | | 2 | | 4 | | 0 |

TABLE 2

| | | Velocity of transverse wave (m/s) | coefficient of linear expansion ρ (/° C.) |
|---|---|---|---|
| Glasses | A | 2030 | 10.2 × 10$^{-6}$ |
| | B | 1990 | 8.4 × 10$^{-6}$ |
| | C | 2160 | 8.0 × 10$^{-6}$ |
| | D | 2880 | 4.2 × 10$^{-6}$ |
| | E | 3380 | 6.0 × 10$^{-6}$ |
| | X | 3770 | 18 × 10$^{-6}$ |
| Dielectric layers | SiO$_2$ | 3757 | 0.5 × 10$^{-6}$ |
| | Si$_3$N$_4$ | 5850 to 6010 | 3.4 × 10$^{-6}$ |
| Piezoelectric substrates | LiTaO$_3$ | 3895 | 16.1 × 10$^{-6}$ |
| | LiNbO$_3$ | 4496 | 15.4 × 10$^{-6}$ |

Figure 2:
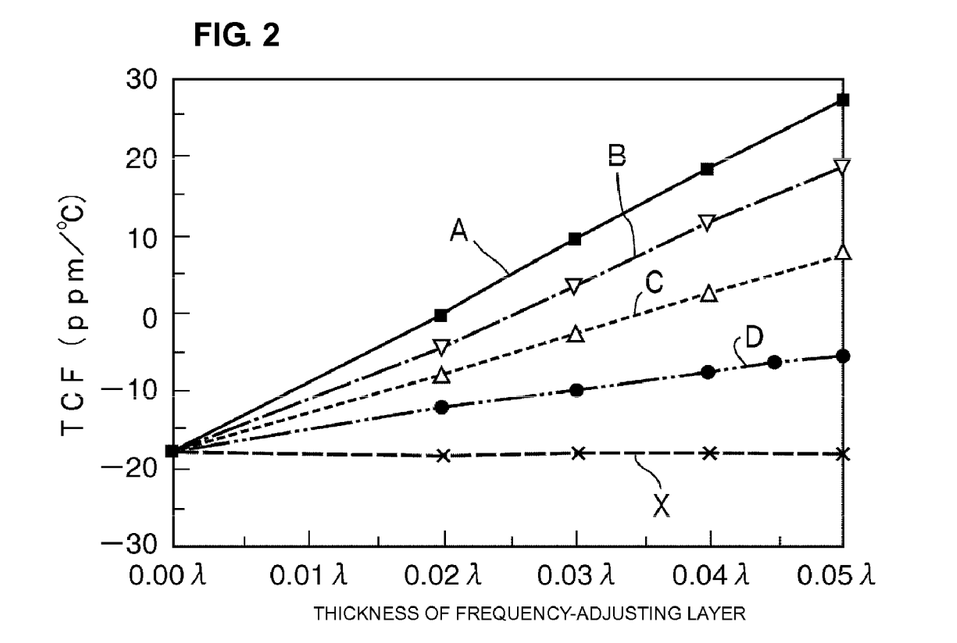
FIG. 2 is a graph showing variations in the temperature coefficient of frequency TCF of the acoustic wave device according to the first preferred embodiment, the thickness of a frequency-adjusting layer and the type of glass used for the frequency-adjusting layer being varied.

FIG. 2 shows the relationship between the thickness of each frequency-adjusting layer 5 made of one of Glasses A to E and X and the temperature coefficient of frequency TCF of each acoustic wave device 1.

As shown in FIG. 2, the acoustic wave devices that include the frequency-adjusting layers made of Glass X and having a greater thickness have a slightly smaller temperature coefficient of frequency TCF. In contrast, the acoustic wave devices that include the frequency-adjusting layers made of Glasses A to E and having a greater thickness have a positively shifted temperature coefficient of frequency TCF. That is, the presence of the frequency-adjusting layers 5 made of Glasses A to E enables the acoustic wave devices to have a positively shifted temperature coefficient of frequency TCF because Glasses A to E have a velocity of transverse wave that is less than the velocity of transverse wave (about 3757 m/s) of SiO$_2$ used to form the temperature characteristic-improving layers 4.

Figure 3:
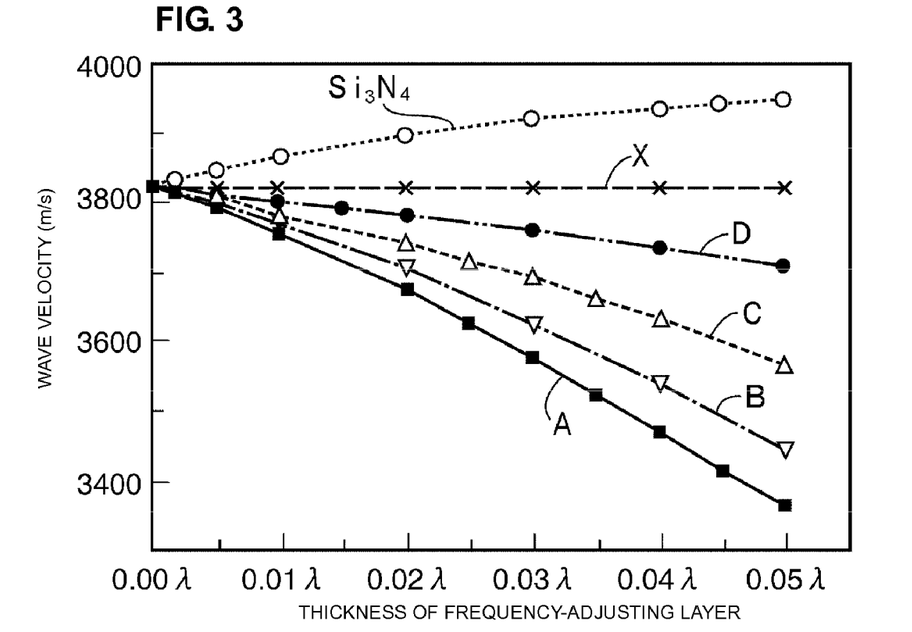
FIG. 3 is a graph showing variations in wave velocity of the acoustic wave device according to the first preferred embodiment, the thickness of the frequency-adjusting layer and a material used for the frequency-adjusting layer being varied.

FIG. 3 shows the relationship between the thickness of each $Si_3N_4$ layer or frequency-adjusting layer made of one of the glasses and the velocity of a Love wave, which is a type of surface acoustic wave.

As shown in FIG. 3, the frequency-adjusting layers made of Glasses A to E and having a greater thickness have a lower wave velocity. In contrast, the $Si_3N_4$ layers having a greater thickness have a greater wave velocity.

Therefore, it is clear that frequency adjustment can be performed by adjusting the thickness of the frequency-adjusting layers 5 made of Glasses A to E, such that the wave velocities are reduced, that is, frequencies are increased.

As shown in FIGS. 2 and 3, the use of Glasses A to E, which have velocities of transverse wave that are less than that of $SiO_2$, to define the temperature characteristic-improving layers enables the acoustic wave devices 1 to have a positively shifted temperature coefficient of frequency TCF. Furthermore, the presence of the glass thin-films enables the absolute value of the temperature coefficient of frequency TCF to be reduced even if the temperature characteristic-improving layers 4 have a relatively small thickness that makes it is difficult to adjust the absolute value of the temperature coefficient of frequency TCF to be close to zero. As shown in FIG. 3, frequency adjustment can be performed such that frequencies are reduced.

In order to secure the temperature coefficient of frequency TCF of a conventional acoustic wave device, a $SiO_2$ temperature characteristic-improving layer was formed so as to have a relatively large thickness and a frequency-adjusting $Si_xN_y$ layer was formed thereon. Since the $SiO_2$ temperature characteristic-improving layer had a relatively large thickness, the conventional acoustic wave device was inferior in terms of insertion loss and other characteristics. However, according to preferred embodiments of the present invention, the glasses having a relatively small wave velocity were used to form frequency-adjusting layers, whereby $SiO_2$ temperature characteristic-improving layers were allowed to have a relatively small thickness and characteristics, such as insertion losses, were improved by about 1 dB.

Figure 4:
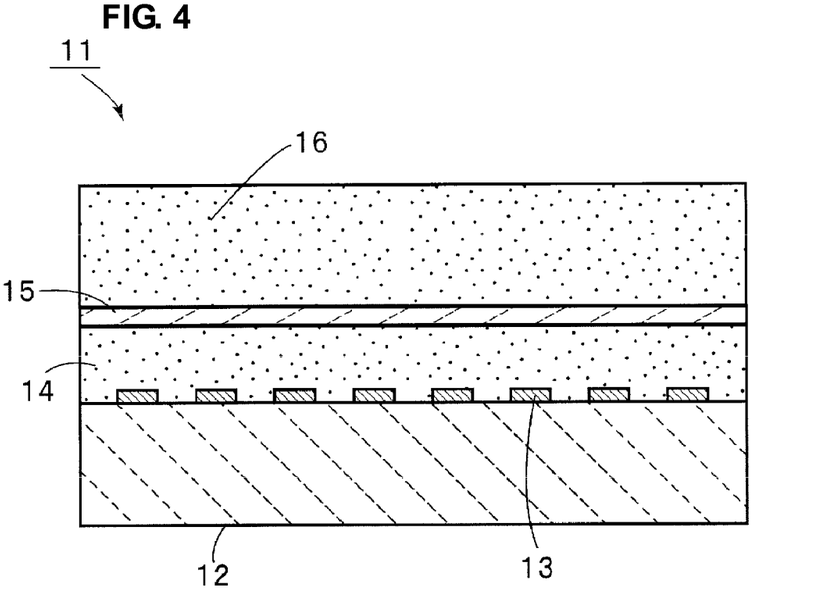
FIG. 4 is a schematic front sectional view of an acoustic wave device according to a second preferred embodiment of the present invention.

FIG. 4 is a front sectional view of an acoustic wave device according to a second preferred embodiment of the present invention. The acoustic wave device 11 includes a piezoelectric substrate 12, IDT electrodes 13 disposed thereon, and a first temperature characteristic-improving layer 14 extending over the IDT electrodes 13. The acoustic wave device 11 further includes a frequency-adjusting layer 15 and a second temperature characteristic-improving layer 16 disposed on the first temperature characteristic-improving layer 14 in that order. In other words, the first and second temperature characteristic-improving layers 14 and 16 are arranged on both surfaces of the frequency-adjusting layer 15.

In this preferred embodiment, the piezoelectric substrate is preferably a $LiNbO_3$ substrate with Euler angles (0°, 105°, 0°). The $LiNbO_3$ substrate has a temperature coefficient of frequency TCF of about −84 ppm/° C. and a coefficient of linear expansion of about $15.4 \times 10^{-6}$/° C. The IDT electrodes 13 are preferably made of Au and preferably have a thickness of about 0.04λ.

The IDT electrodes 13 may be made of another metal or an alloy or each may include a multilayer metal film including a plurality of deposited metal layers.

In this preferred embodiment, the first and second temperature characteristic-improving layers 14 and 16 are preferably made of $SiO_2$ and the sum of the thickness of the first temperature characteristic-improving layer 14 and that of the second temperature characteristic-improving layer 16 is preferably about 1.5λ, for example, wherein λ represents the wavelength of a boundary acoustic wave.

The frequency-adjusting layer 15 preferably includes a glass thin-film and is made of glass having a velocity of transverse wave that is less than that of $SiO_2$.

In this preferred embodiment, the sum of the thicknesses of the first and second temperature characteristic-improving layers 14 and 16 is preferably about 1.5λ, for example. Thus, a boundary acoustic wave propagating along the interface between the piezoelectric substrate 2 and the first temperature characteristic-improving layer 14 is excited by energizing the IDT electrodes 13, so that frequency characteristics can be obtained using the boundary acoustic wave. Therefore, the acoustic wave device 11 is a boundary acoustic wave device.

In this preferred embodiment, $LiNbO_3$ has a negative temperature coefficient of frequency TCF and the first and second temperature characteristic-improving layers 14 and 16 are made of $SiO_2$ having a positive temperature coefficient of frequency TCF. Thus, the temperature coefficient of frequency TCF of the device can be adjusted to be close to zero. Even if the sum of the thicknesses of the first and second temperature characteristic-improving layers 14 and 16 is insufficient to adjust the temperature coefficient of frequency TCF of the device to be close to zero, the presence of the frequency-adjusting layer 15, which includes the glass thin-film having a velocity of transverse wave that is less than that of $SiO_2$, enables the temperature coefficient of frequency TCF of the device to be positively shifted. This enables the absolute value of the temperature coefficient of frequency TCF of the device to be relatively small.

Frequency adjustment can be performed by adjusting the thickness of the frequency-adjusting layer 15 such that frequencies are increased as described in the first preferred embodiment. This described below with reference to FIGS. 5 and 6.

Figure 5:
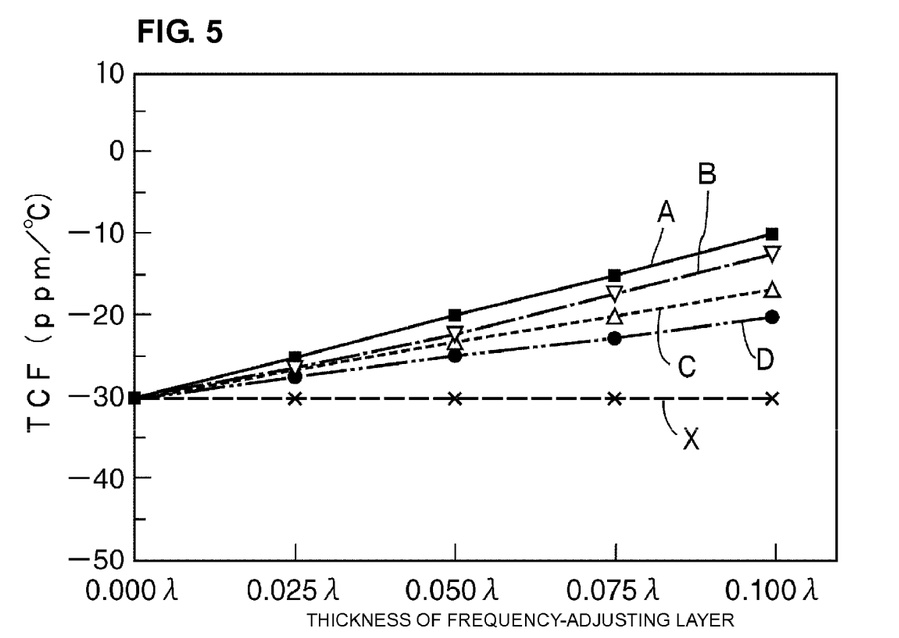
FIG. 5 is a graph showing variations in the temperature coefficient of frequency TCF of the acoustic wave device according to the second preferred embodiment, the thickness of a frequency-adjusting layer and the type of glass used for the frequency-adjusting layer being varied.

FIG. 5 is a graph showing the relationship between the thickness of frequency-adjusting layers 15 made of one of Glasses A to E and X and the temperature coefficient of frequency TCF of acoustic wave devices 1 similar to the above-described acoustic wave device. Layers 14 and 16 have a thickness of about 0.4λ and about 1.1λ, respectively.

As shown in FIG. 5, the devices including the frequency-adjusting layers made of Glass X have substantially the same temperature coefficient of frequency TCF. However, the devices including the frequency-adjusting layers 15 made of Glasses A to E and having a greater thickness have a positively shifted temperature coefficient of frequency TCF, the frequency-adjusting layers 15 including glass thin-films with a velocity of transverse wave that less than that of $SiO_2$. Therefore, even if the first and second temperature characteristic-improving layers 14 and 16 have a relatively small thickness, and therefore, have a relatively small effect on improving the temperature characteristics of the devices, the presence of the frequency-adjusting layers 15 enables the temperature coefficient of frequency TCF of the devices to be close to zero.

Figure 6:
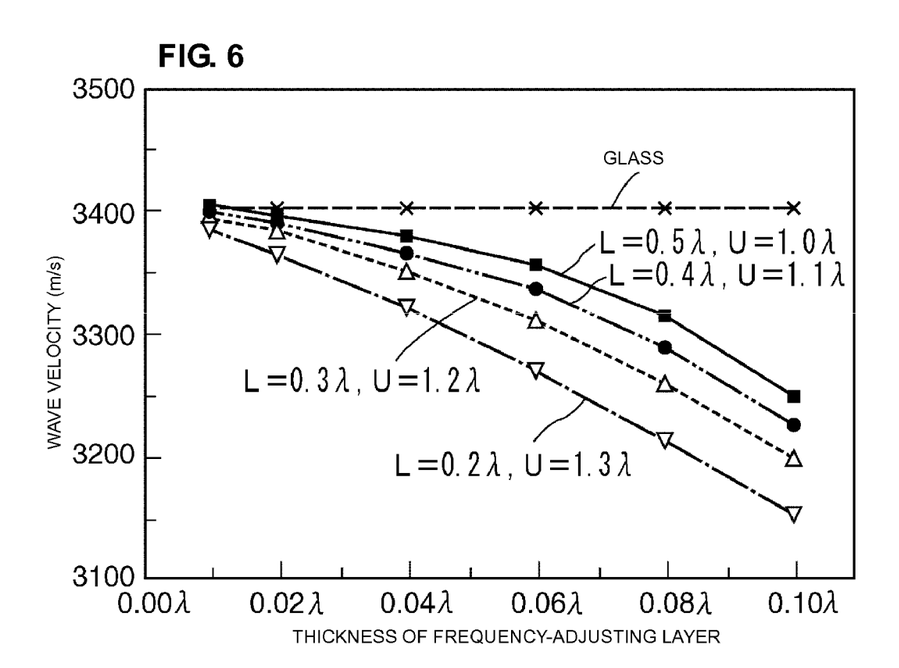
FIG. 6 is a graph showing variations in wave velocity of the acoustic wave device according to the second preferred embodiment, the thickness of the frequency-adjusting layer and a material used for the frequency-adjusting layer being varied.

FIG. 6 is a graph showing the relationship between a variation in the thickness of $SiO_2$ films that are included in first and second temperature characteristic-improving layers 14 and 16 and a change in the velocity of a boundary acoustic wave, the first and second temperature characteristic-improving layers 14 and 16 being included in acoustic wave devices. These acoustic wave devices further include piezoelectric substrates 12, IDT electrodes 13, and frequency-adjusting layers 15. With reference to FIG. 6, L represents the thickness of the first temperature characteristic-improving layers 14 and U represents the thickness of the second temperature characteristic-improving layers 16.

These glass thin-films are made of Glass A shown in Table 1.

For comparison, the following results are also shown in FIG. 6: results obtained from first and second temperature characteristic-improving layers 14 and 16, made of Glass X instead of Glass A, having a thickness of about 0.3λ and about 1.2λ, respectively.

As shown in FIG. 6, when Glass X is used, the wave velocity is substantially constant regardless of the thickness of the frequency-adjusting layers 15. This shows that the use of Glass X is insufficient for frequency adjustment. In contrast, when Glass A is used, the wave velocity decreases with an increase in the thickness of the frequency-adjusting layers 15 that include the glass thin-films, regardless of whether the sum of the thicknesses of the first and second temperature characteristic-improving layers 14 and 16 is about 1.5λ and the ratio of the thickness of each first temperature characteristic-improving layer 14 and that of each second temperature characteristic-improving layer 16 is varied. This shows that frequency adjustment can be performed by adjusting the thickness of the frequency-adjusting layers 15, such that frequencies are reduced. When the sum of the thicknesses of the first and second temperature characteristic-improving layers 14 and 16 is less that about 1.5λ, substantially the same results as described above are obtained.

Therefore, it is clear that the second preferred embodiment, similar to the first preferred embodiment, provides an acoustic wave device which is relatively slim, which has a temperature coefficient of frequency TCF with an absolute value close to zero and outstanding frequency-temperature characteristics, and in which frequency adjustment can be readily performed such that a desired resonant frequency and/or a desired center frequency is obtained.

In the second preferred embodiment, the boundary acoustic wave is used. The reduction of the thickness of the first and second temperature characteristic-improving layers 14 and 16 made of $SiO_2$ enables the acoustic wave device to use a surface acoustic wave.

In the first preferred embodiment, the reduction of the thickness of the temperature characteristic-improving layer 4 made of $SiO_2$ enables the acoustic wave device 1 to use a boundary acoustic wave.

In the above-described preferred embodiments of the present invention, the temperature characteristic-improving layers 4, 14, and 16 are preferably made of $SiO_2$, for example, but may be made of a silicon oxide other than $SiO_2$. A material used for the temperature characteristic-improving layers 4, 14, and 16 is not limited to such a silicon oxide, and may be one of titanium oxides, aluminum oxides, and other oxides, for example.

In preferred embodiments of the present invention, the piezoelectric substrates have a negative temperature coefficient of frequency TCF. Thus, the temperature characteristic-improving layers have a positive temperature coefficient of frequency TCF and may be made of various materials. The frequency-adjusting layers 5 and 15 preferably have a velocity of transverse wave that is less than that of a material used for one of the temperature characteristic-improving layers and a glass material used for the frequency-adjusting layer 5 or 15 is not particularly limited.

The frequency-adjusting layers 5 and 15 made of Glasses A to D preferably have a coefficient of linear expansion that is less than that of the piezoelectric substrate 2 or 12. This reduces fluctuations in frequency characteristics due to temperature changes as shown in FIGS. 2 and 6 because the expansion and contraction of the frequency-adjusting layers 5 and 15 due to temperature changes are relatively small.

Figure 7:
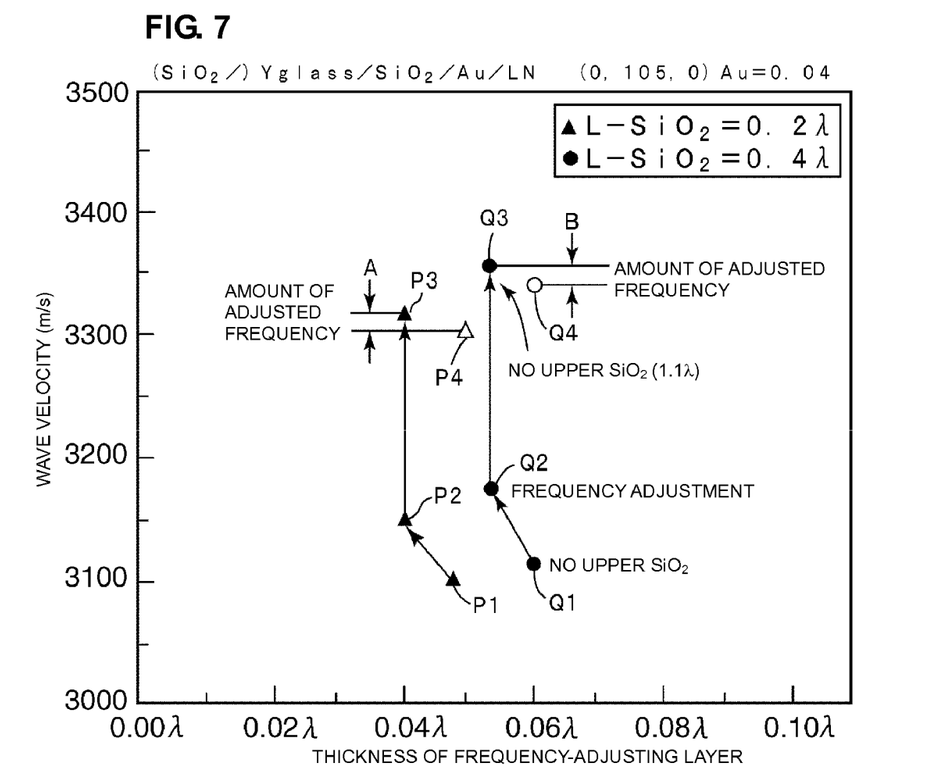
FIG. 7 is a graph showing the relationship between the thickness of a frequency-adjusting layer included in the acoustic wave device according to the second preferred embodiment and the wave velocity thereof and describes the course of performing frequency adjustment by varying the frequency-adjusting layer.

FIG. 7 is a graph showing the relationship between the thickness of thick frequency-adjusting layers 15 included in acoustic wave devices similar to the acoustic wave device of the second preferred embodiment and the wave velocity thereof, and is intended to describe frequency adjustment for achieving frequencies less than a desired frequency.

With reference to FIG. 7, Point P1 represents the wave velocity of a structure in which the following components are arranged on a piezoelectric substrate 12 in this order: IDT electrodes 13, a first temperature characteristic-improving layer 14 including a $SiO_2$ film having a thickness of about 0.2λ, and a frequency-adjusting layer 15 which is made of Glass A and which has a thickness of about 0.048λ as plotted on the horizontal axis in FIG. 7. The acoustic wave device has a frequency that is less than a desired frequency, and therefore, the thickness of the frequency-adjusting layer 15 is reduced to about 0.04λ by etching. Point P2 represents the wave velocity of the resulting acoustic wave device. These show that the reduction of the thickness of the frequency-adjusting layer 15 enables the wave velocity thereof to vary from about 3100 m/s to about 3150 m/s.

An acoustic wave device including a frequency-adjusting layer 15 which is arranged on an upper surface thereof and which has a thickness of about 1.3λ has a wave velocity of about 3340 m/s as represented by Point P3.

Point P4 represents the wave velocity of a structure in which the following components are arranged on a piezoelectric substrate 12 in this order: a first temperature characteristic-improving layer 14 with a thickness of about 0.2; a frequency-adjusting layer which has a thickness of about 0.048λ, which is made of Glass A, and which is unprocessed for frequency adjustment; and a frequency-adjusting layer 15 including a $SiO_2$ film with a thickness of about 1.3λ. A difference in wave velocity indicated by Arrow A in FIG. 7 corresponds to the amount of an adjusted frequency. In other words, the wave velocity is varied by the amount indicated by Arrow A by reducing the thickness of the frequency-adjusting layer 15, which includes a glass thin-film having a thickness from about 0.048λ to about 0.04λ, which corresponds to the adjusted frequency amount achieved by varying the thickness of the frequency-adjusting layer 15.

Points Q1 to Q3 represent the wave velocities of structures substantially to same as those having the wave velocities represented by Points P1 to P3 except that lower first temperature characteristic-improving layers 14 have a thickness of about 0.4λ and upper temperature characteristic-improving layers 16 have a thickness of about 1.1λ. Point Q4 represents the wave velocity of a structure including a frequency-adjusting layer 15 whose thickness is not reduced. A difference in wave velocity indicated by Arrow B in FIG. 7 corresponds to the amount of a frequency adjusted by varying the thickness of a frequency-adjusting layer 15.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave device comprising:
   a piezoelectric substrate;
   interdigital transducer electrodes disposed on the piezoelectric substrate;

a temperature characteristic-improving layer extending over the piezoelectric substrate and the interdigital transducer electrodes; and a frequency-adjusting layer disposed on the temperature characteristic-improving layer; wherein the piezoelectric substrate is made of a piezoelectric material having a negative temperature coefficient of frequency TCF;

the temperature characteristic-improving layer is made of a material having a positive temperature coefficient of frequency TCF; and the frequency-adjusting layer includes a glass thin-film having a velocity of transverse wave that is less than a velocity of transverse wave of the temperature characteristic-improving layer and having a coefficient of linear expansion that is less than a coefficient of linear expansion of the piezoelectric substrate.

2. The acoustic wave device according to claim 1, wherein the glass thin-film is made of an inorganic material including at least two inorganic oxides and one of the at least two inorganic oxides is a silicon oxide.

3. The acoustic wave device according to claim 1, wherein the acoustic wave device is a surface acoustic wave device utilizing a surface acoustic wave propagating on the piezoelectric substrate.

4. An acoustic wave device comprising:

a piezoelectric substrate;

interdigital transducer electrodes disposed on the piezoelectric substrate;

a first temperature characteristic-improving layer extending over the piezoelectric substrate and the interdigital transducer electrodes;

a frequency-adjusting layer disposed on the first temperature characteristic-improving layer; and a second temperature characteristic-improving layer disposed on the frequency-adjusting layer; wherein the piezoelectric substrate is made of a piezoelectric material having a negative temperature coefficient of frequency TCF;

the first and second temperature characteristic-improving layers are made of a material having a positive temperature coefficient of frequency TCF; and the frequency-adjusting layer includes a glass thin-film having a velocity of transverse wave that is less than a velocity of transverse wave of the first and second temperature characteristic-improving layers and having a coefficient of linear expansion less than a coefficient of linear expansion of the piezoelectric substrate.

5. The acoustic wave device according to claim 4, wherein the glass thin-film is made of an inorganic material including at least two inorganic oxides and one of the at least two inorganic oxides is a silicon oxide.

6. The acoustic wave device according to claim 4, wherein the acoustic wave device is a boundary acoustic wave device utilizing a boundary acoustic wave propagating along an interface between the piezoelectric substrate and the temperature characteristic-improving layer.

7. The acoustic wave device according to claim 4, wherein the temperature characteristic-improving layer is made of at least one material selected from the group consisting of silicon oxides, titanium oxides, and aluminum oxides.

* * * * *